(12) United States Patent
Choi

(10) Patent No.: US 10,892,139 B2
(45) Date of Patent: Jan. 12, 2021

(54) ICP ANTENNA AND SUBSTRATE PROCESSING DEVICE INCLUDING THE SAME

(71) Applicant: EUGENE TECHNOLOGY CO., LTD., Yongin-si (KR)

(72) Inventor: Yoon Seok Choi, Suwon-si (KR)

(73) Assignee: EUGENE TECHNOLOGY CO., LTD., Yongin-si (KR)

(*) Notice: Subject to any disclaimer, the term of this patent is extended or adjusted under 35 U.S.C. 154(b) by 0 days.

(21) Appl. No.: 16/480,355

(22) PCT Filed: Dec. 5, 2017

(86) PCT No.: PCT/KR2017/014150
§ 371 (c)(1),
(2) Date: Jul. 24, 2019

(87) PCT Pub. No.: WO2018/147537
PCT Pub. Date: Aug. 16, 2018

(65) Prior Publication Data
US 2019/0385814 A1    Dec. 19, 2019

(30) Foreign Application Priority Data
Feb. 10, 2017    (KR) .................. 10-2017-0018738

(51) Int. Cl.
*H01J 37/32*    (2006.01)
*H03H 7/38*    (2006.01)

(52) U.S. Cl.
CPC ..... *H01J 37/3211* (2013.01); *H01J 37/32183* (2013.01); *H03H 7/38* (2013.01)

(58) Field of Classification Search
CPC ... H01J 37/3211; H01J 37/32183; H03H 7/38
USPC ...................................... 438/798
See application file for complete search history.

(56) References Cited

U.S. PATENT DOCUMENTS 4,629,887 A  * 12/1986  Bernier .................. H05H 1/46
                                                                250/251

* cited by examiner

*Primary Examiner* — Elias Ullah
(74) *Attorney, Agent, or Firm* — Rabin & Berdo, P.C.

(57) ABSTRACT

Provided is an ICP antenna used in a plasma processing device. The ICP antenna includes an antenna coil having one end connected to an RF power source through an impedance matching circuit and the other end that is grounded; and a variable capacitor connected in parallel to a portion of the antenna coil.

5 Claims, 8 Drawing Sheets

ICP ANTENNA AND SUBSTRATE PROCESSING DEVICE INCLUDING THE SAME

TECHNICAL FIELD

The present invention relates to an ICP antenna and a substrate processing device including the same and, more particularly, to an ICP antenna having a structure in which a variable capacitor is connected to a portion of the ICP antenna in parallel to be able to improve uniformity of plasma density on a substrate processing surface, and a substrate processing device including the same.

BACKGROUND ART

In substrate processing devices used in a recent semiconductor process, a semiconductor circuit has been extremely miniaturized, a substrate for manufacturing the semiconductor circuit has been enlarged, and a liquid crystal display has had a wide area. Thus, there is trend that the entire processing areas have been enlarged but an internal circuit has been miniaturized. Accordingly, there is need for integrating much more elements in a limited area, and also researches and developments for improving the uniformity of the elements disposed on the entire enlarged surface are being conducted.

Plasma processing devices used as substrate processing devices are dry-type processing devices in which a reaction gas inside a chamber is made to be activated to form plasma and then a substrate is processed by the formed plasma, and the plasma processing devices are divided into a capacitively coupled plasma (CCP) method and an inductively coupled plasma (ICP) method, according to the type of an electrode.

The CCP method applies a high frequency to a pair of plate shape electrodes, which are generally parallel to each other, to generate plasma by means of an electric filed generated in a space between the electrodes, and thus the CCP method has the advantage that it has performances of the accurate capacity coupling adjustment and the ion adjustment to provide the high process productivity when compared to the ICP method. On the other hand, because energy of radio frequency power is generally exclusively transmitted to the plasma through the capacity coupling, the plasma ion density may be adjusted only by the increase or decrease in capacitively coupled radio frequency power. Therefore, the high radio frequency power is needed to generate the high density plasma. However, the increase in radio frequency power leads to increase ion impact energy. Therefore, in order to prevent damage due to the ion impact, there is a limitation to increase the radio frequency power to be supplied.

Figure 1:
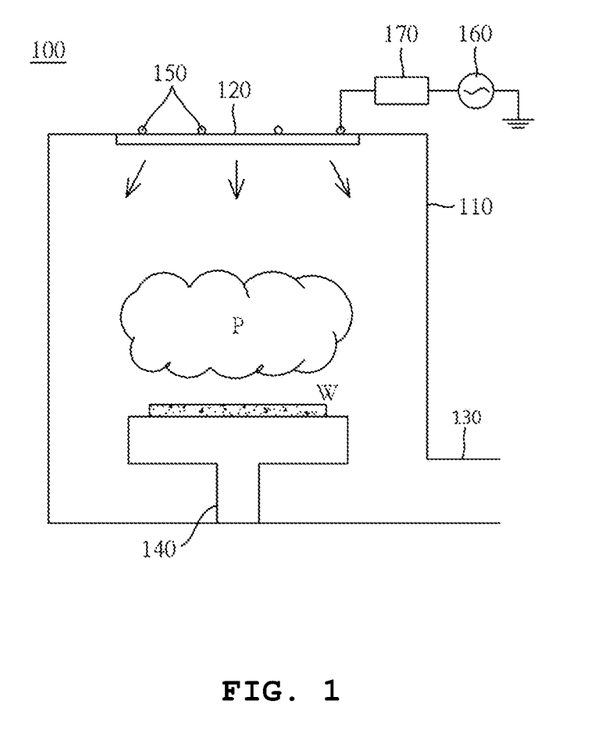
FIG. 1 is a schematic view showing a configuration for an inductively coupled plasma processing device according to the prior art.
Figure 2:
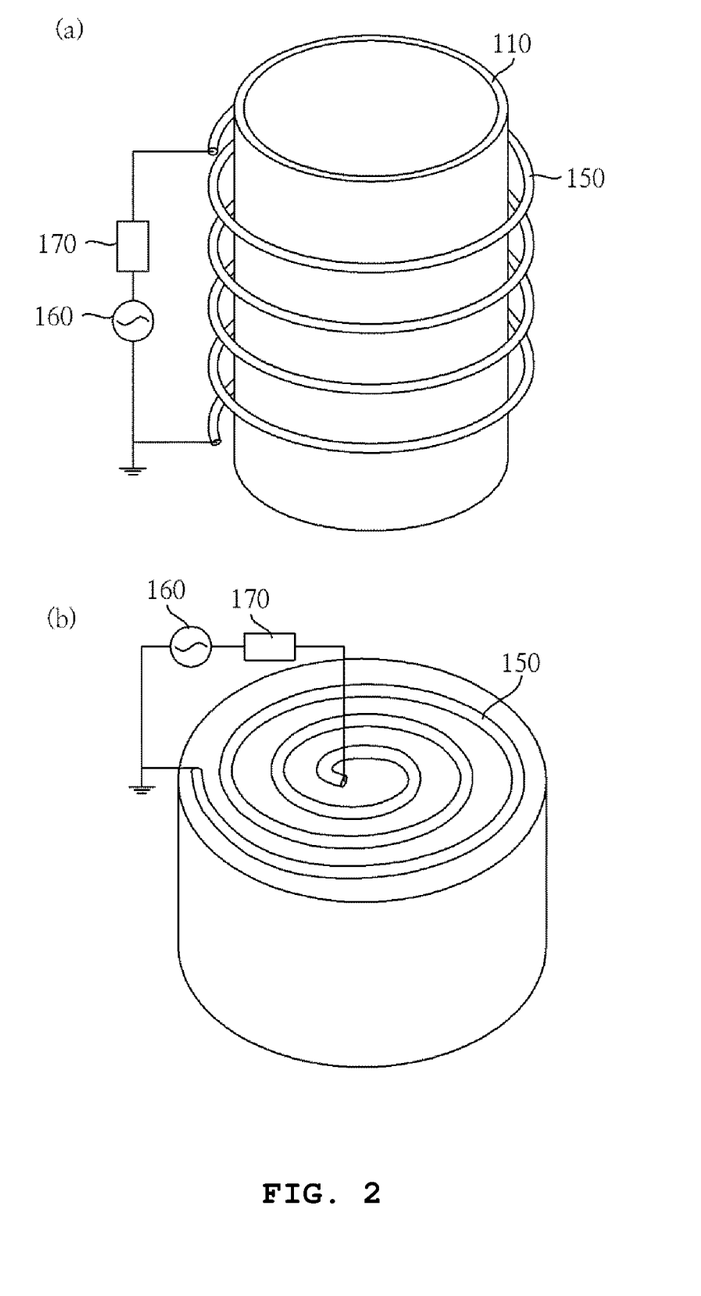
FIG. 2 is a view showing a configuration related to an antenna in the inductively coupled plasma processing device according to the prior art.

On the other hand, the ICP method applies a high frequency to an antenna that has generally a spiral shape, and accelerates electrons of the inside of a chamber, by means of an electric filed induced according to a change of a magnetic field caused by high frequency current introduced to the antenna. Thus, it is known that the ICP method is appropriate to generate the high density plasma because it may easily increase the ion density as the radio frequency power increases but the ion impact resulting from the increase of the radio frequency power is relatively low. Therefore, in the substrate processing device using the plasma, it is a general trend that the ICP method is used to generate the high density plasma. FIG. 1 is a schematic view showing a configuration for an inductively coupled plasma processing device of the prior art, and FIG. 2 is a view showing a configuration related to an antenna in the inductively coupled plasma processing device of the prior art.

Referring to FIG. 1, the inductively coupled plasma processing device 100 of the prior art includes: a chamber 110 in which a substrate W to be processed by plasma P is disposed; a gas spraying part 120 that supplies, to the inside of the chamber 110, a source gas for processing the substrate; a gas discharging hole 130 through which a residual gas and an unreacted gas after processing the substrate are discharged; a susceptor 140 which is disposed in the chamber 110 and on which the substrate to be processed is disposed; an antenna 150 positioned in an upper portion or a sider surface of the chamber 110 to provide a magnetic filed and an electric filed for generating plasma P in the chamber; a high frequency oscillator 160 (RF generator) for applying source power to the antenna; and an impedance matching circuit 170 for matching characteristic impedance of a connecting cable connected to the high frequency oscillator 160, with load impedance.

Such a plasma processing device may be classified into a pancake type antenna, a cylindrical antenna, and a dome type antenna, according to a shape of an antenna and a dielectric window. For an inductively coupled plasma processing device of the prior art, FIG. 2A shows a shape of the pancake type antenna, and FIG. 2B shows a shape of the cylindrical antenna.

However, since the ICP method causes non-uniform plasma due to an antenna coil shape and a frequency, it is difficult to design the antenna coil, and there is a limitation to increase a frequency. Also, since the distance between a plasma source and a substrate is larger than that of the CCP method, the behavior of the plasma is determined by the spread, which makes the uniformity of the plasma determined on the substrate to be processed.

DISCLOSURE

Technical Problem

The present invention provides an ICP antenna in which a variable capacitor is connected to the ICP antenna in parallel to be able to improve uniformity of plasma on a substrate processing surface, and a substrate processing device including the same.

Further another object of the present invention will become evident with reference to following detailed descriptions and drawings.

Technical Solution

In accordance with an exemplary embodiment of the present invention, an ICP antenna includes: an antenna coil having one end connected to an RF power source through an impedance matching circuit and the other end that is grounded; and a variable capacitor connected in parallel to a portion of the antenna coil.

The ICP antenna may include a resistor connected in parallel to the variable capacitor.

The antenna coil may be a cylindrical antenna coil.

In the case that the antenna coil is the cylindrical antenna coil, the antenna coil may have the one end disposed in an upper portion thereof and the other end disposed in a lower portion thereof, and the variable capacitor may be connected to either an upper coil portion having the one end of the antenna coil or a lower coil portion having the other end of the antenna coil.

The antenna coil may be a pancake type antenna coil.

In the case that the antenna coil is the pancake type antenna coil, the antenna coil may have the one end disposed outside and the other end disposed inside, and the variable capacitor may be connected to an outer coil portion having the one end of the antenna coil or an inner coil portion having the other end of the antenna coil.

In accordance with another exemplary embodiment of the present invention, a substrate processing device includes: a chamber in which a substrate to be processed by plasma is disposed; a gas spraying part that supplies a source gas for processing the substrate to be processed, to the inside of the chamber; a gas discharging hole through which a residual gas and an unreacted gas inside the camber are discharged after processing the substrate to be processed; a susceptor on which the substrate to be processed is disposed; the ICP antenna of any one of claims 1 to 6; a high frequency oscillator for applying source power to the ICP antenna; and an impedance matching circuit connected between the ICP antenna and the high frequency oscillator.

The substrate processing device may further include a variable capacitor adjusting part for adjusting a variable capacitor of the ICP antenna.

Advantageous Effects

The present invention has the effect that the variable capacitor is connected to the portion of the antenna in parallel to be able to improve uniformity of plasma on the substrate processing surface.

BEST MODE

Hereinafter, preferred embodiments of the present invention will be described in more detail with reference to FIGS. 3 to 9. The present invention may be embodied in different forms and should not be construed as limited to the embodiments set forth herein. Rather, the embodiments are provided to explain the present invention more completely to those skilled in the art to which the present invention pertains. Therefore, the dimensions of each component shown in the figures are exaggerated for clarity of description.

Figure 3:
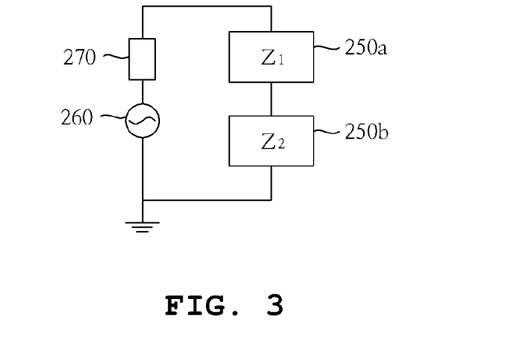
FIG. 3 is a conceptual view showing a configuration of an ICP antenna according to the present invention.

FIG. 3 is a conceptual view showing a configuration of an ICP antenna according to the present invention. As illustrated in FIG. 3, an ICP antenna according to the present invention may be conceptually considered that, for substantially one coil, impedance is divided into two with respect to a specific point to thereby form a circuit in which two impedances are connected in series to each other. A first impedance Z1 is referred to the impedance of a coil portion having one end connected to an RF power source 260 through an impedance matching circuit 270, and a second impedance is referred to the impedance of a coil portion having the other end that is grounded.

In this case, when the second impedance Z2 increases, the impedance of the entire coil increases, and total coil current flowing through the ICP antenna is decreased. As the coil current decreases, the power applied to the first impedance Z1 decreases, and thus the plasma generated by a coil portion corresponding to the first impedance Z1 also decreases. However, when the impedance increases, the plasma power increases. In a coil portion corresponding to the second impedance Z2, while approaching a resonance condition by means of an LC parallel connection and an capacity adjustment of a variable capacitor, inductor current and capacitor current according to the resonance condition flow, and the impedance increases. In this case, although the coil current measured in a coil input end is decreased, the plasma may be decreased, maintained, or increased by the increase in impedance of the second impedance Z2.

As described above, in the present invention, the ICP antenna is assumed to be an antenna in which two impedances are connected in series to each other, and one of two impedances is controlled to adjust both impedances. As described below, the plasma uniformity on a surface of a substrate to be processed (hereinafter, "the substrate to be processed" is referred to as "a target substrate" in the detailed description.) may be controlled by means of the impedance adjustment by region.

Figure 4:
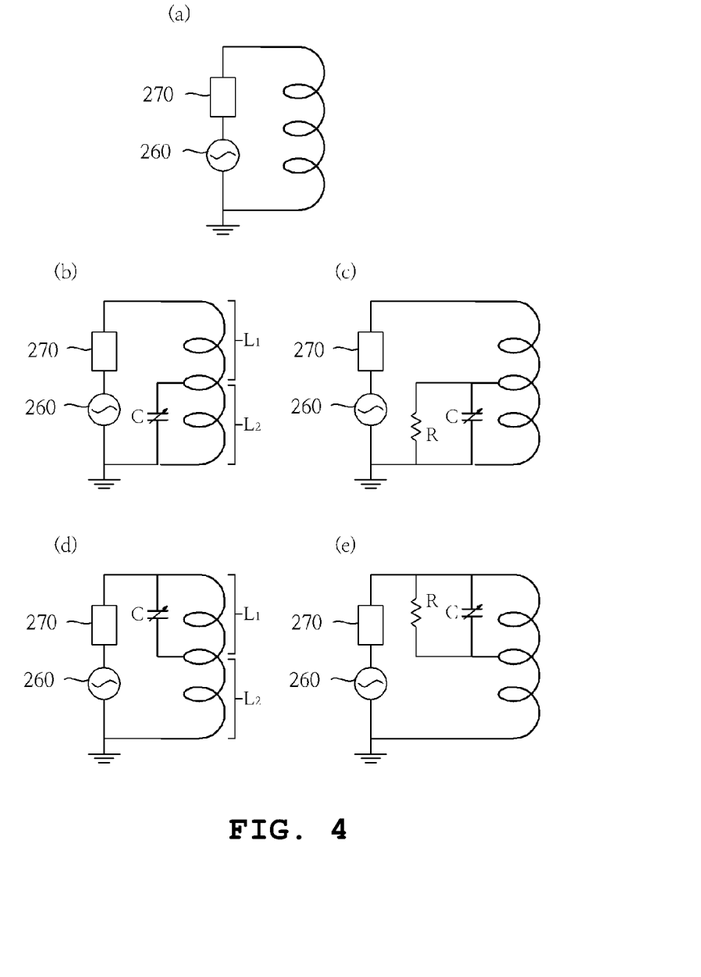
FIG. 4 is a view showing a configuration of an ICP antenna according to an embodiment of the present invention.

Hereinafter, a configuration and an effect of an ICP antenna according to an embodiment of the present invention will be described with reference to FIGS. 4 to 6. FIG. 4 is a view showing a configuration of an ICP antenna according to an embodiment of the present invention. FIG. 4A shows a configuration of a cylindrical ICP antenna of the prior art. FIG. 4B shows an antenna configuration in which a variable capacitor is connected in parallel to a lower antenna according to an embodiment of the present invention. FIG. 4C shows an antenna configuration in which a resistor connected in parallel to the variable capacitor of FIG. 4B is further included. FIG. 4D shows an antenna configuration in which a variable capacitor is connected in parallel to an upper antenna. FIG. 4E shows an antenna configuration in which a resistor connected in parallel to the variable capacitor of FIG. 4D is further included.

Figure 5:
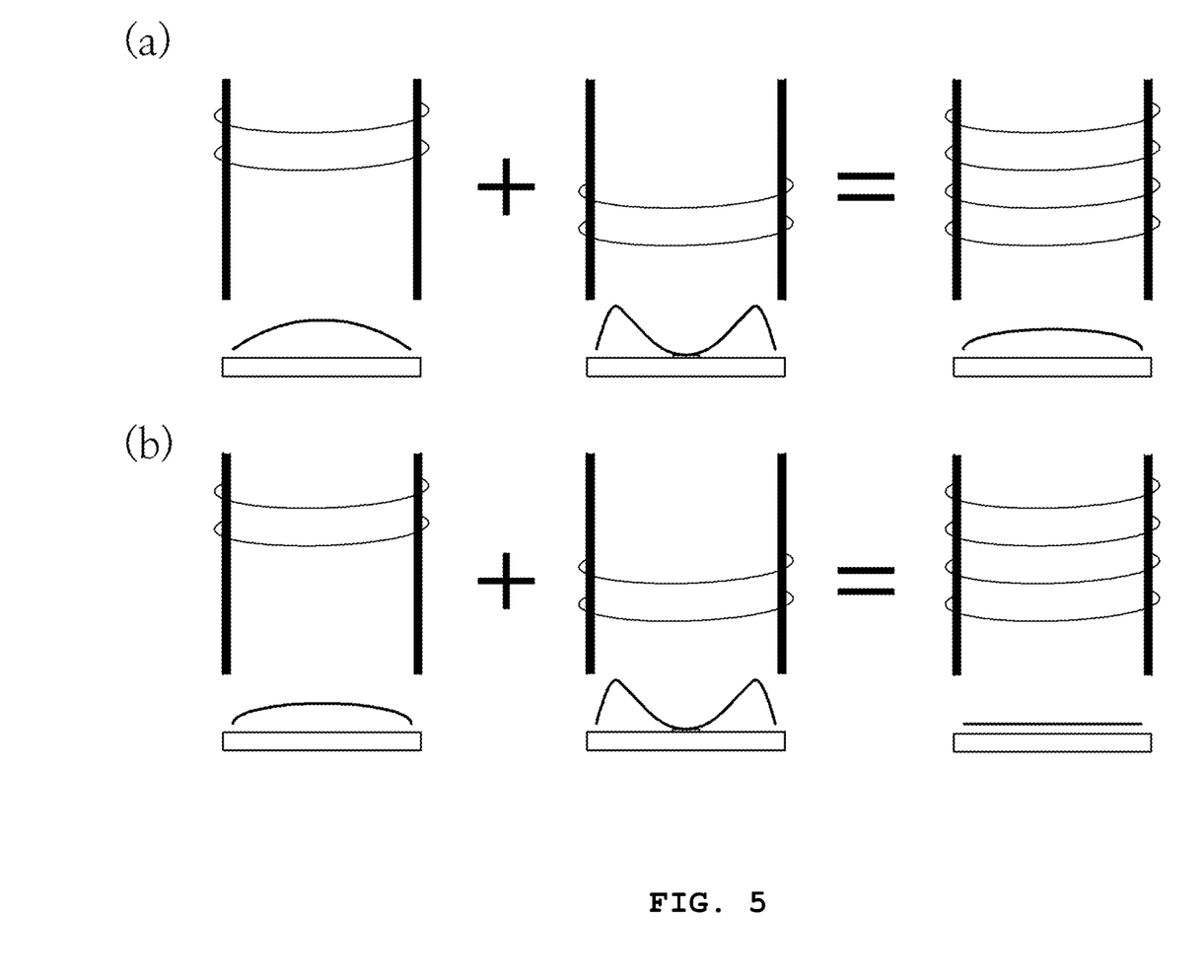
FIG. 5 is a view showing a variation of plasma distribution from the ICP antenna configuration illustrated in FIG. 4B.

FIG. 5 is a view showing a variation of plasma distribution from the ICP antenna configuration illustrated in FIG. 4B. FIG. 5A schematically shows density distribution of plasma on a surface of the target substrate, which is generated by the cylindrical ICP antenna of the prior art. FIG. 5B schematically shows density distribution of plasma on a surface of the target substrate, which is generated by the ICP antenna illustrated in FIG. 4B.

Generally, an electric filed induced to the cylindrical ICP antenna generates ring shape plasma with a predetermined radius, and the generated plasma spreads toward a chamber and the center of the target substrate disposed in a lower portion of the chamber. Thus, as a spread distance is longer, the plasma density of the central portion becomes higher.

As can be seen with reference to FIG. 5A, in the case of the cylindrical ICP antenna of the prior art, plasma generated by an upper coil, as spreading to a substrate disposed in a lower portion of a chamber, exhibits density distribution of a mountain shape in which high density is shown at the center of the substrate. However, plasma generated by a lower coil has a short spread distance, and thus reaches a surface of a target substrate while having a ring shape density distribution, as in plasma generated by an induced electric filed. Therefore, plasma density distribution, which has a shape in which the plasma generated by the upper coil and the plasma generated by the lower coil are superposed on each other, is formed on the surface of the target substrate. Referring to FIG. 5A, it may be confirmed that the plasma density on the surface of the target substrate has a high density at the center of the substrate.

Therefore, the ICP antenna according to an embodiment of the present invention adjusts the entire plasma density by connecting a variable capacitor in parallel to the lower antenna as illustrated in FIG. 4B. As described above with reference to FIG. 3, when the variable capacitor is connected in parallel to the lower antenna, the second impedance Z2 corresponding to the lower antenna is increased, which makes the total impedance of the antenna increase, and thus the total coil current flowing through the antenna decreases. Therefore, the plasma power applied to the upper antenna decreases, resulting in decrease of the plasma density generated in the upper antenna. On the other hand, for the lower antenna, although the coil current decreases due to the increase in impedance, the plasma power may be maintained, and thus the generated plasma density is prevented from decreasing.

As described above, when the ICP antenna according to an embodiment of the present invention is adopted, the plasma density, which is generated by the upper antenna and then spread, decreases as illustrated in FIG. 5B. Therefore, it may be confirmed that the plasma density on the surface of the target substrate may be uniformly distributed in a radial direction, when compared to the ICP antenna of the prior art.

Figure 6:
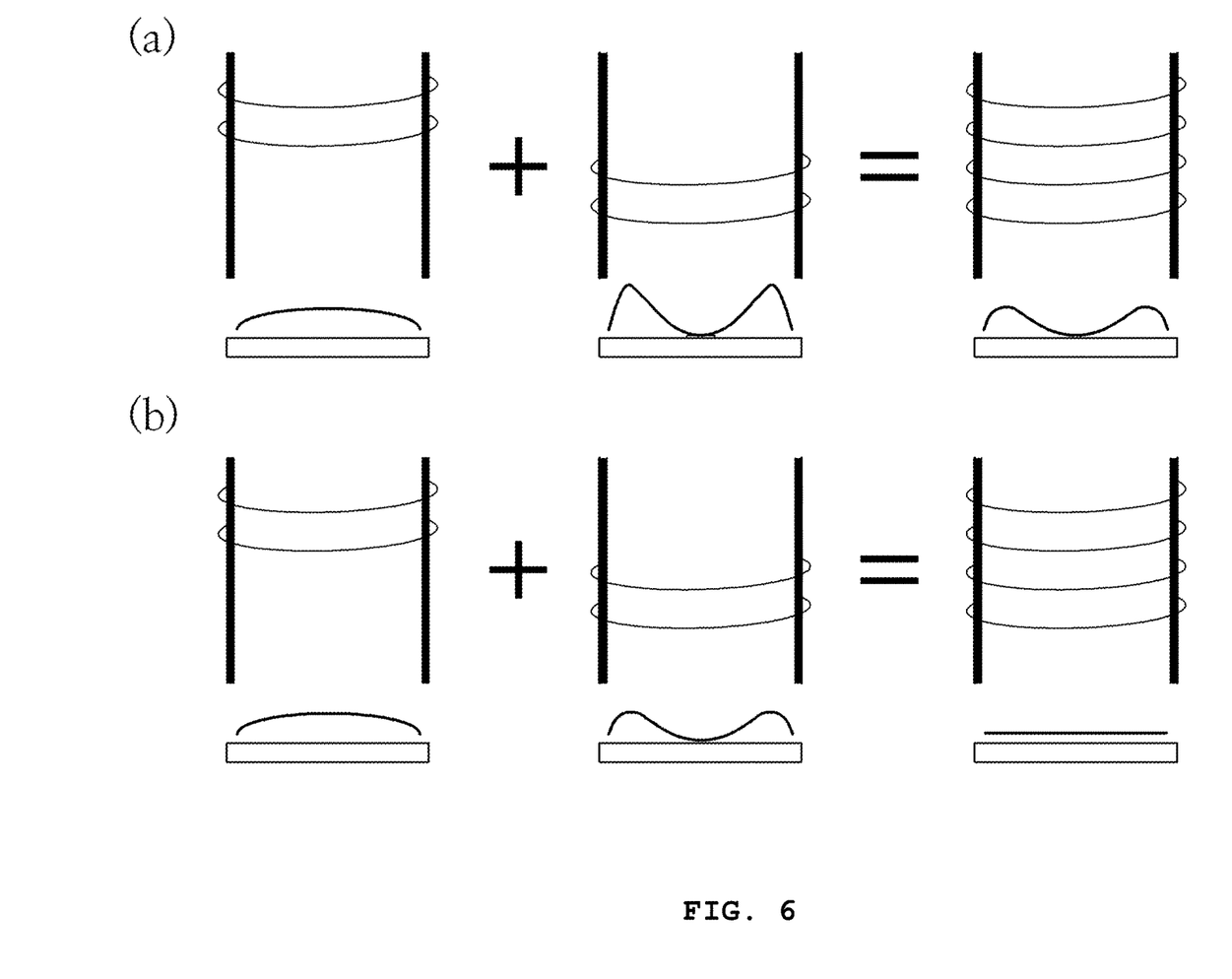
FIG. 6 is a view showing a variation of plasma distribution from the ICP antenna configuration illustrated in FIG. 4D.

FIG. 6 is a view showing a variation of plasma distribution from the ICP antenna configuration illustrated in FIG. 4D. FIG. 6A schematically shows density distribution of plasma on a surface of the target substrate, which is generated by the cylindrical ICP antenna of the prior art. FIG. 6B schematically shows density distribution of plasma on a surface of the target substrate, which is generated by the ICP antenna illustrated in FIG. 4D.

As can be seen with reference to FIG. 6A, in the case of the cylindrical ICP antenna of the prior art as in FIG. 5A, plasma generated by an upper coil forms density distribution of a mountain shape on a surface of a target substrate, and plasma generated by a lower coil forms density distribution of a ring shape on the surface of the target substrate. However, in the case of FIG. 6A, the plasma density generated by the upper antenna is relatively lower than that of FIG. 5A, and thus it may be confirmed that the entire plasma density on the surface of the target substrate has the distribution in which the density at the center of the substrate is low.

Therefore, the ICP antenna according to an embodiment of the present invention may adjust the entire plasma density by connecting a variable capacitor in parallel to the upper antenna as illustrated in FIG. 4D. As described above with reference to FIG. 3, when the variable capacitor is connected in parallel to the upper antenna, the first impedance Z1 corresponding to the upper antenna is increased, which makes the total impedance of the antenna increase, and thus the total coil current flowing through the entire antenna decreases. Therefore, the plasma power applied to the lower antenna decreases, resulting in decrease of the plasma density generated in the lower antenna. On the other hand, for the upper antenna, although the coil current decreases due to the increase in impedance, the plasma power may be maintained, and thus the generated plasma density is prevented from decreasing.

As described above, when the ICP antenna according to an embodiment of the present invention is adopted, the plasma density, which is generated by the lower antenna and then spread, decreases as illustrated in FIG. 6B. Therefore, the entire plasma density on the surface of the target substrate is uniformly distributed in the radial direction, when compared to the ICP antenna of the prior art.

As illustrated in FIGS. 4C and 4E, an ICP antenna according to another embodiment of the present invention may further include a resistor connected in parallel to a variable capacitor. As the resistor is further included, the variability in adjusting the impedance may be further extended. In the embodiment, the resistor with a predetermined value is described to be connected in parallel to the variable capacitor, but the embodiment is not limited thereto. For another example, a variable resistor may be connected in parallel to the variable capacitor.

Figure 7:
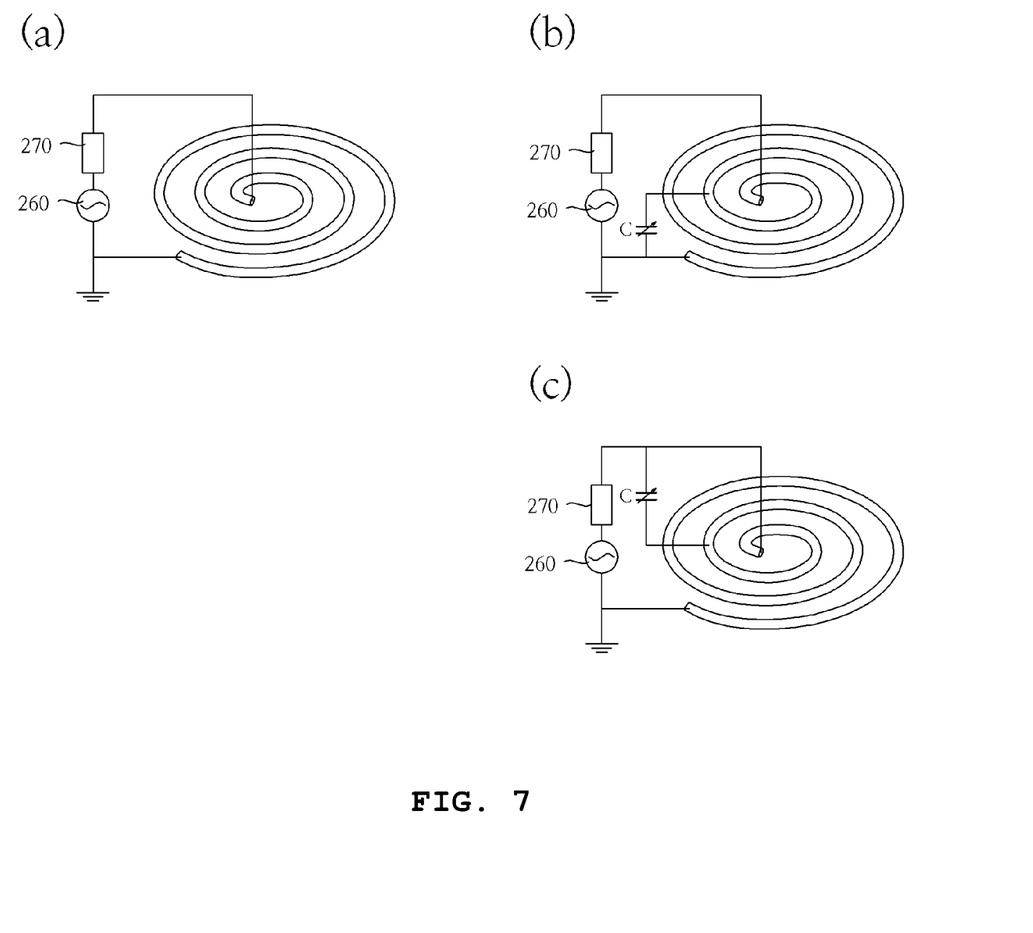
FIG. 7 is a view showing a configuration of an ICP antenna according to another embodiment of the present invention.

FIG. 7 is a view showing a configuration of an ICP antenna according to another embodiment of the present invention. The ICP antenna of FIG. 7 is similar to that illustrated in FIG. 4, except that the pancake antenna is applied. FIG. 7A shows a configuration of a pancake type ICP antenna of the prior art. FIG. 7B shows an antenna configuration in which a variable capacitor is connected in parallel to an outer antenna according to an embodiment of the present invention. FIG. 7C shows an antenna configuration in which a variable capacitor is connected in parallel to an inner antenna. Although not illustrated in FIG. 7, a resistor or a variable resistor may be connected in parallel to the variable capacitor, as in FIGS. 4C and 4E.

As in the cylindrical antenna, the impedance of the entire antenna is made to be high by connecting a variable capacitor in parallel to the outer antenna as illustrated in FIG. 7B, and thus capable of decreasing the plasma density of a mountain shape, which is generated by the inner antenna and then spread. Also, a capacitor is connected to the inner antenna as illustrated in FIG. 7C, and thus capable of decreasing the plasma density of a donut shape, which is generated by the outer antenna and then spread.

As described above, the present invention has the effect that the variable capacitor is connected in parallel to a portion of the ICP antenna, and thus the plasma density on the surface of the target substrate may be uniform in the radial direction.

Figure 8:
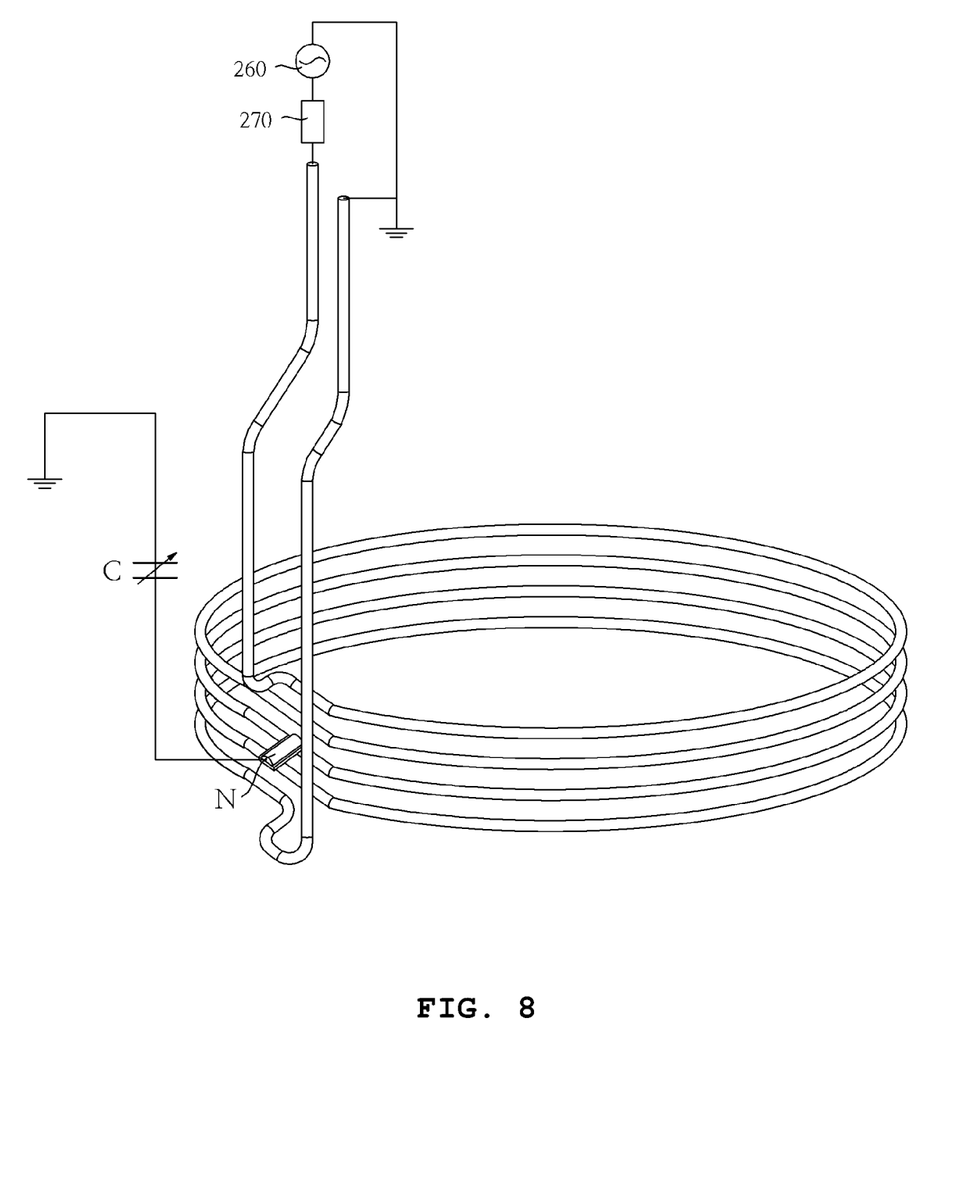
FIG. 8 is a view showing a shape of an ICP antenna actually realized according to an embodiment of the present invention.

FIG. 8 is a view showing a shape of an ICP antenna actually realized according to an embodiment of the present invention. In the embodiment, an ICP antenna for 300 mm was used, and a coil wound with an even number of turns (four turns wound coil) was used for uniformity of plasma density in the radial direction. A tap was formed at a location N where the second winding ends, which is central portion in the four turns wound coil, and then a variable capacitor was connected to the tap. Also, although not illustrated, a control knob is connected to the variable capacitor, and thus capacitance of the variable capacitor may be adjusted.

As illustrated above, the ICP antenna of the present invention may further include the resistor connected in parallel to the variable capacitor. When this resistor is a variable resistor, the resistor may adjust resistance of the variable resistor by means of a control knob as in the case of the capacitor.

Figure 9:
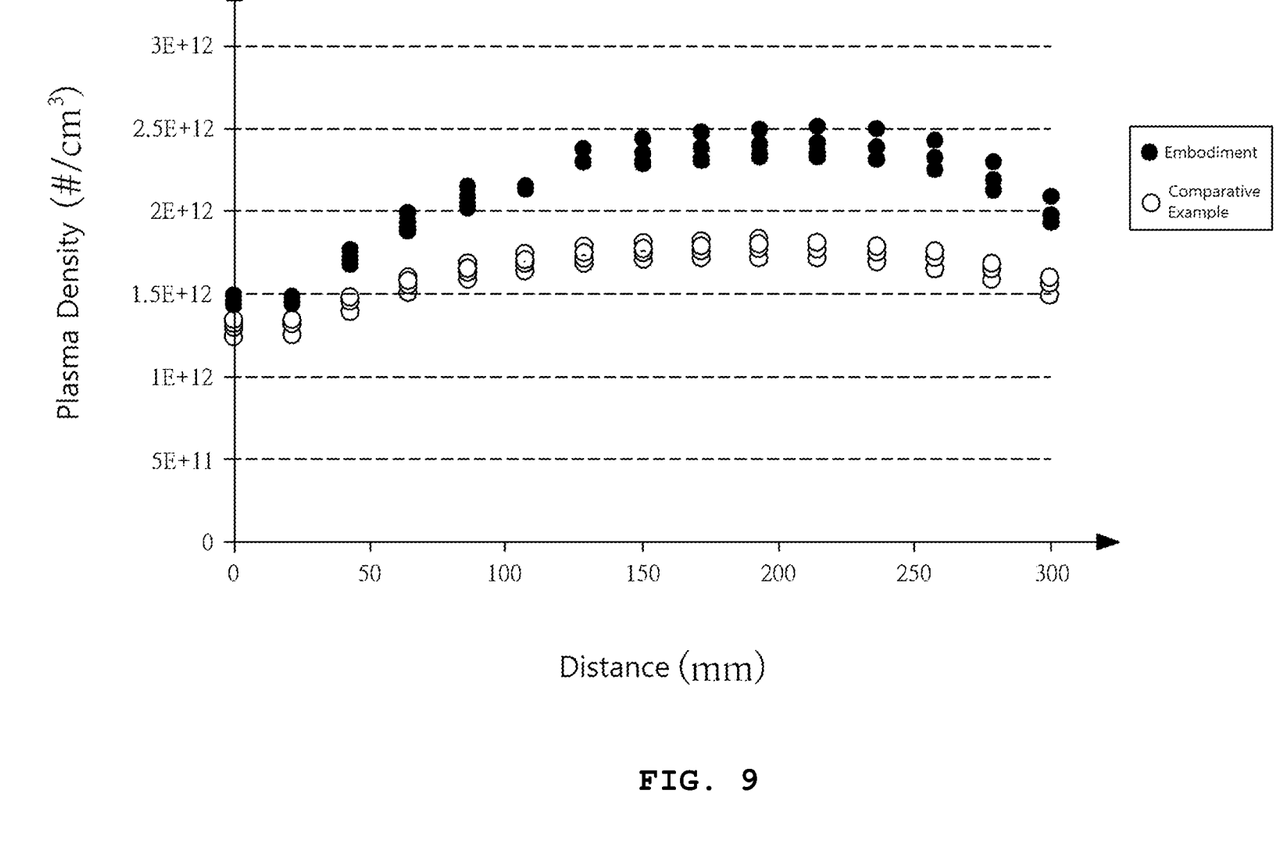
FIG. 9 is a graph showing plasma distribution measured on a surface of a substrate to be processed, before and after a variable capacitor is applied.

FIG. 9 is a graph showing plasma distribution measured on a surface of a target substrate, before and after a variable capacitor is applied. In FIG. 9, a horizontal axis represents the radial distance from the center of the target substrate, and a vertical axis represents the plasma density. In the graph, a solid circle represents the plasma density from the ICP antenna of the prior art (a comparative example), which is not provided with the variable capacitor. On the other hand, an open circle represents the ICP antenna (the embodiment), which is provided with the variable capacitor.

As illustrated in FIG. 9, the present invention can improve the uniformity of the plasma density on the surface of the target substrate only by connecting the variable capacitor to the portion of the antenna coil in parallel to adjust its value under the same condition as the ICP antenna of the prior art.

Although the present invention is described in detail with reference to the exemplary embodiments, the invention may be embodied in many different forms. Thus, technical idea and scope of claims set forth below are not limited to the preferred embodiments.

INDUSTRIAL APPLICABILITY

The present invention may be applicable to a various apparatus for manufacturing semiconductor or a various method for manufacturing semiconductor.

What is claimed is:

1. A method for processing a substrate disposed in a chamber using plasma generated in the chamber by an inductively coupled plasma (ICP) antenna, the ICP antenna comprising a first impedance having a first antenna coil positioned on a first region of the chamber and a second impedance having a second antenna coil positioned on a second region of the chamber, and a variable capacitor connected in parallel to the second antenna coil to form an LC circuit, the first impedance and the second impedance being connected in series to each other so that the ICP antenna having has one end connected to an RF power source through an impedance matching circuit and another end that is grounded, the method comprising:

adjusting capacitance of the variable capacitor so that the LC circuit approaches a LC resonance condition;

increasing impedance of the second impedance and a total impedance of the ICP antenna; and decreasing a total current of the ICP antenna and a density of a first plasma generated by the first antenna coil so that a uniformity of a total plasma generated in the chamber is controlled.

2. The method of claim 1, wherein a density of a second plasma generated by the second antenna coil is maintained.

3. The method of claim 1, the method further comprising adjusting resistance of a variable resistor connected in parallel to the variable capacitor.

4. The method of claim 1, wherein the first antenna coil and the second antenna coil is a cylindrical antenna coil positioned in a side surface of the chamber, and wherein one of the first antenna coil and the second antenna coil is positioned on an upper region of the chamber and another of the first antenna coil and the second antenna coil is positioned on a lower region of the chamber.

5. The method of claim 1, wherein the first antenna coil and the second antenna coil are pancake-type antenna coils, and wherein one of the first antenna coil and the second antenna coil is positioned on an inner region of the chamber and another of the first antenna coil and the second antenna coil is positioned on an outer region of the chamber.

* * * * *